United States Patent [19]

Alvarez, Jr.

[11] 4,010,388

[45] Mar. 1, 1977

[54] LOW POWER ASYNCHRONOUS LATCH

[75] Inventor: Cesar E. Alvarez, Jr., Griffith, Ind.

[73] Assignee: Teletype Corporation, Skokie, Ill.

[22] Filed: Feb. 18, 1976

[21] Appl. No.: 659,068

[52] U.S. Cl. .............................. 307/279; 307/246; 307/251; 307/270

[51] Int. Cl.² ................ H03K 3/286; H03K 3/353; H03K 17/04; H03K 17/10

[58] Field of Search ...... 307/205, 214, 246, 247 R, 307/251, 270, 279, 289

[56] References Cited

UNITED STATES PATENTS

| | | | |
|---|---|---|---|
| 3,562,559 | 2/1971 | Rapp | 307/279 |
| 3,639,813 | 2/1972 | Kamoshida et al. | 307/279 X |
| 3,755,690 | 8/1973 | Smith | 307/251 X |
| 3,812,384 | 5/1974 | Skorup | 307/279 X |
| 3,846,643 | 11/1974 | Chu et al. | 307/247 R |
| 3,911,289 | 10/1975 | Takemoto | 307/205 |
| 3,942,047 | 3/1976 | Buchanan | 307/279 X |

OTHER PUBLICATIONS

De Simone, "Dynamic Gating Circuit," IBM Tech. Discl. Bull., vol. 18, No. 3, pp. 638–639, Aug. 1975.

Primary Examiner—John S. Heyman
Assistant Examiner—Larry N. Anagnos
Attorney, Agent, or Firm—W. K. Serp; M. Pfeffer

[57] ABSTRACT

The output of a fast-acting ratioless logic circuit is monitored by a sensing device, and when one selected logic output is sensed, a voltage is applied to the output node to latch the output to that state. To effect rapid return to the other state, a switch is provided to deactivate the applied voltage when the output node is established at the other state. The latching is made permanent by the further application of a refresh clock which periodically pulses the output node whenever the one selected state is latched.

10 Claims, 3 Drawing Figures

LOW POWER ASYNCHRONOUS LATCH

BACKGROUND OF THE INVENTION

This invention relates to latch circuits and, more particularly, to fast-acting low power semiconductor latches which respond to asynchronous inputs.

The prior art contains many latch circuits. The most common configuration consists of two cross-coupled gates such as a NOR-gate. The speed of this type of circuit is, however, limited by the characteristics of the pull-up device for each gate. In circuits embodied using metal-oxide-semiconductor-field-effect transistors, hereinafter referred to as MOSFETs, decreasing the length of the pull-up MOSFET reduces the switching time but it also increases the power consumption of the circuit and increases the amount of chip area used since the pull-down device must be accordingly enlarged to maintain an adequate impedance ratio.

A circuit designed to reduce the delay in such latch circuits is disclosed in U.S. Pat. No. 3,846,643, issued Nov. 5, 1974, to William M. Chu et al. This circuit, embodied using MOSFETs, operates with two independent input transistors establishing the alternative output voltage states, the first causing the high state and the second causing the low state. The output changes occur as an essentially immediate response to an input to either of the input transistors, but there is no cross-coupling of these devices and hence the output state will not remain latched when the appropriate input ceases to be received unless another mechanism causes latching. The Chu patent discloses for this purpose, a cross-coupled latch mechanism consisting of five transistors. This mechanism monitors the output state and when that state changes, it latches to the changed state causing the output to be maintained after the input is removed. However, the Chu circuit operates in a ratioed manner and causes a significant dc power drain when latched, since the cross-coupled latch mechanism provides a continuous dc path to ground in order to remain latched. The input transistors must be of relatively low impedance compared with the impedance offered by the path to ground through the latch mechanism in the preexisting state. This power consuming characteristic, as well as the limitations provided by the ratioed operation, make it desirable to find an alternative latch circuit which operates without significant delay and without the disadvantages of the Chu design.

Accordingly, it is an object of the present invention to provide a fast-acting, low power, latch.

It is a further object to provide a fast-acting, low power, semiconductor latch using a minimum number of devices.

It is a still further object to provide a fast-acting, low power latch using MOSFET devices; and It is a still further object to provide a fast-acting, low power MOSFET latch which is ratioless in design.

SUMMARY OF THE INVENTION

In accordance with the principles of the present invention, a fast-acting low power ratioless latch circuit specifically suited to MOSFET embodiment is designed using a pair of input devices to establish an output state in response to asynchronous inputs; that is, input signals having no fixed time relation to any other signal applied to the latch circuit. The output is monitored and when a pre-selected voltage (produced by activation of one input device and representing a high state, for example) is sensed, a voltage is applied to latch the output to this voltage. A third device that responds simultaneously with the activation of the input device which establishes the other state is also provided, and this device deactivates the applied voltage and hence a rapid return to the second state can be effected.

The output voltage will leak off in time, causing the monitored voltage to decrease, resulting in the loss of the applied voltage. However, the latch can be made permanent by further addition of a circuit which applies a refresh clock to periodically pulse the output whenever the one selected state is sensed.

In the preferred embodiment using MOSFET devices activation of a first input MOSFET causes the selected output voltage (the high state) to appear. A second MOSFET acts as the second input device, and a third MOSFET is the commonly activated device, which together with the second input device insures a rapid transition to the other (low) state. The output voltage is detected by a fourth MOSFET whose gate is connected to the output. When the selected (high) voltage is present on the output, this MOSFET turns ON. The resultant output of the fourth MOSFET device is an enabling signal which is applied to the gate of a fifth MOSFET causing it to turn ON and when this fifth MOSFET is ON, it provides a conductive path from a voltage source to the output, thus latching the output at the selected (high) state.

When the second MOSFET is activated, the output goes to the second (low) state. In addition, the third MOSFET whose output is connected to the gate of the fifth MOSFET is also activated with the second MOSFET, and it causes the fifth MOSFET to turn OFF rapidly, thereby opening the path from the voltage source to the output and eliminating the applied voltage.

A sixth MOSFET connected as a conditional capacitor can be used to provide a periodic clock to the output. When the output voltage is above the selected level this sixth MOSFET exhibits a high capacitance and the clock is capacitively coupled to the output. However, if the output voltage is below that threshold, this MOSFET will not significantly couple the clock signal. Thus, when the output is at the selected (high) state, the clock boosts the output sufficiently so that the fourth MOSFET senses the required voltage to maintain the fifth MOSFET ON which, in turn, provides the applied voltage to maintain the output in the latched state.

This latching takes place without any dc path to ground during the latched state. It operates rapidly since latching actually occurs after the output state has been established. Further, the circuit operates in a ratioless manner so that the devices used can be sized to provide the optimum operating speed without considering impedance ratios.

DETAILED DESCRIPTION

The description hereinafter is described in terms of P-channel MOSFETs of the enhancement mode type. It is understood, of course, that other embodiments of the principles of the invention are possible and many alternative embodiments will occur to those skilled in the art. In particular, bipolar transistors could be used to implement the invention and, of course, P-channel MOSFET devices of the depletion mode type, as well as N-channel enhancement or depletion mode MOSFETs, could be used with the appropriate changes known to those skilled in the art.

Figure 1:
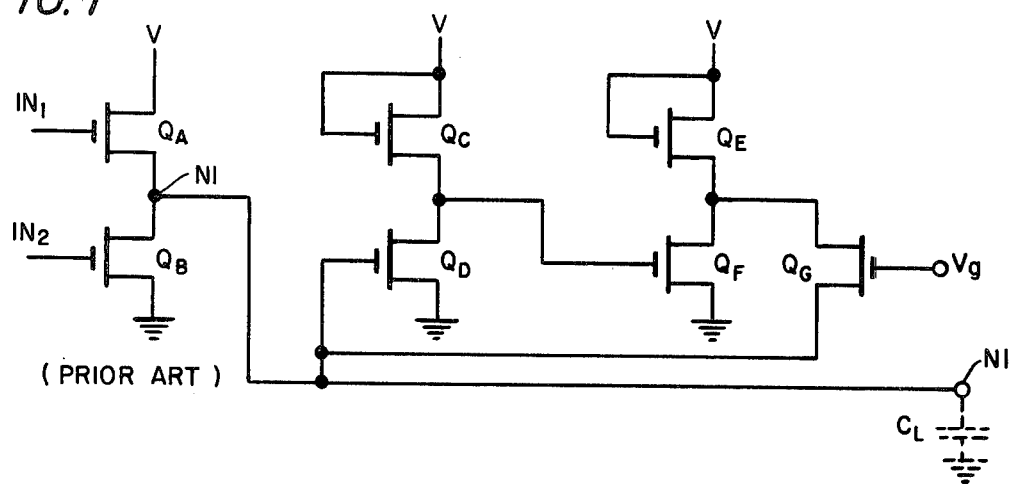
FIG. 1 is a schematic diagram of a latch circuit in accordance with the prior art technology.

The circuit in FIG. 1 is essentially the circuit disclosed in the aforementioned Chu patent except that it has been drawn for P-channel devices instead of N-channel devices in order to be consistent with the disclosure of the present invention. Two input terminals $IN_1$ and $IN_2$ are available. Each is connected to the gate of a pair of serially connected input devices shown illustratively as MOSFETs $Q_A$ and $Q_B$, respectively. For P-channel devices the source of MOSFET $Q_B$ is grounded; the drain of MOSFET $Q_A$ is connected to a voltage source V, which would be negative relative to ground, and the source of MOSFET $Q_A$ and the drain of MOSFET $Q_B$ are connected together at node N1. The voltage at node N1 is the output and it is applied across the load shown as capacitor $C_L$.

A pulse applied at one input terminal, such as $IN_1$, which is generally termed the SET input causes MOSFET $Q_A$ to turn ON, causing the voltage at node N1 to approach V (hereinafter referred to as high). Similarly, the pulse applied at the other input terminal, such as $N_2$, which is generally termed the RESET input, causes MOSFET $Q_B$ to turn ON, resulting in the voltage at node N1 going to ground (hereinafter referred to as low).

The switching between high and low output voltage states will depend, of course, upon the impedance of the input device ($Q_A$ or $Q_B$) relative to the impedance of the rest of the circuit. The remainder of the circuit is a cross-coupled latch consisting of MOSFET $Q_C$ and $Q_D$ connected as a first inverter, MOSFET $Q_E$ and $Q_F$ connected as a second inverter and MOSFET $Q_G$ which provides a path from the out-put of the second inverter to the input of the first inverter. Node $N_1$ is also connected to the input of the first inverter. The latch senses the output voltage change caused by an input pulse, and by virtue of the feedback from the second inverter to the first inverter it locks to the voltage sensed on node $N_1$. For instance, if node $N_1$ is low, and a pulse is applied to $N_1$ causing MOSFET $Q_A$ to turn ON, the voltage at $N_1$ will change, but only if the impedance of MOSFET $Q_A$ is low, relative to the impedance of the latch; that is, the sum of the impedances of MOSFETs $Q_F$ and $Q_G$ which together provide the path from node $N_1$ to ground. Similarly, if MOSFET $Q_B$ has an impedance low relative to the sum of the impedances of $Q_E$ and $Q_G$, an input (RESET) applied at $N_2$ will cause the output node to switch from the high to the low state.

It can be recognized that this circuit operates as a conventional ratioed circuit. The speed of transitions will be determined by the impedance ratios. In addition, when the latch is maintaining the voltage at node $N_1$ constant (a latched condition), a path from the voltage source V to ground necessarily exists and hence the circuit dissipates dc power. It is noted that when the high voltage is being latched, the path from voltage source V to ground is provided via the first inverter (MOSFETs $Q_C$ and $Q_D$), and when the latch is maintaining a low voltage on node $N_1$ the dc path is provided via the second inverter (MOSFETs $Q_E$ and $Q_F$).

In operation, the latch operates as follows: when node $N_1$ is high, the output of the first inverter is low, turning MOSFET $Q_F$ off; hence causing the output of the second inverter to go high which, if MOSFET $Q_G$ is ON (as determined by its externally provided gate voltage $V_a$), is applied back to lock node A in the high state. Alternatively, if node $N_1$ is low, the output of the first inverter is high, causing MOSFET $Q_F$ to turn ON, thereby grounding the output of the second inverter and providing the low state to node $N_1$ via MOSFET $Q_G$. MOSFET $Q_G$ can, of course, provide other functions such as an alternative input, but its primary purpose is to provide isolation.

Hence, the circuit of FIG. 1 will, subject to speed limitations imposed by the relative impedances of the devices, latch node $N_1$ to either the high or the low state last received at the inputs $IN_1$ and $IN_2$, respectively. It will, however, dissipate significant power. In addition, for some applications the ratio requirements will restrict other design considerations since large area devices may be necessary in the cross-coupled latch, such as when the input signals are of very short duration. It is also noted that the circuit operates with two gate delays before latch occurs which further hampers its ability to operate in high speed applications.

Figure 2:
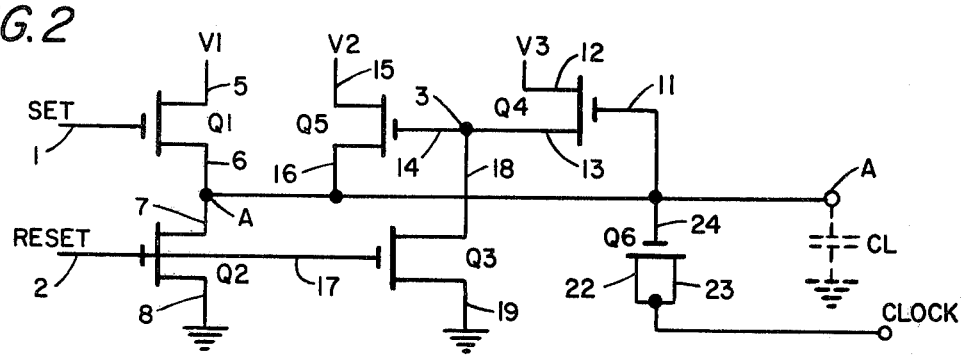
FIG. 2 is a schematic diagram of a latch circuit in accordance with the present invention.

The circuit of FIG. 2 is an alternative configuration and in accordance with the present invention it operates without the ratioed characteristics of the circuit of FIG. 1, and without the speed limitations and power consumption of the previous circuit.

In FIG. 2 inputs can be applied to either of two devices shown as MOSFETs Q1 and Q2. The source 8 of MOSFET Q2 is grounded. The drain 5 of MOSFET Q1 is connected to a voltage source V1 which is negative relative to ground for P-channel MOSFET circuits. The source 6 of MOSFET Q1 and the drain 7 of MOSFET Q2 are connected together at node A, thus forming a conventional series connected pair of MOSFET devices. The first possible input, designated SET, is applied to input terminal 1, the gate of MOSFET Q1. The other possible input, designated RESET, is applied to INPUT terminal 2, the gate of MOSFET Q2.

Node A is the output terminal of the circuit and the output voltage is applied across the load device which may be subsequent stages of logic, shown representatively as capacitor $C_L$. The latch is set by pulsing terminal 1 with an input (SET) pulse. This turns ON MOSFET Q1 and provides a conductive path to node A so that the voltage at node A approaches V1 or the SET voltage (the high state), thus causing the output load $C_L$ to be charged. Node A would, of course, eventually cease to remain at the high state after the SET pulse is removed, if it were not for additional circuitry, and therefore MOSFETs Q4 and Q5 are provided to latch the output to the high state. MOSFET Q4 monitors the voltage at node A and initiates the latch operation. Its gate 11 is connected to node A and the voltage V3 is applied to its drain 12. Its source 13 is connected to the gate 14 of MOSFET Q5. Thus, when the voltage on node A is high (above the turn-ON voltage of MOSFET Q4) MOSFET Q4 turns ON, creating a path from the source of voltage V3 to an intermediate node 3 to which the gate 14 of MOSFET Q5 is connected. This voltage at node 3 serves as an enabling signal causing MOSFET Q5 to turn ON. The drain 15 of MOSFET Q5 is connected to the source of voltage V2 and its source 16 is connected to output node A. When MOSFET Q5 turns ON, the voltage V2 is therefore applied to node A creating the latched condition which, as it is described below, is quasi-permanent.

When the reset pulse is applied to the gate 2 of MOSFET Q2, this turns MOSFET Q2 ON, grounding node A and providing the load $C_L$ with a discharge path to ground. This action also terminates the latching operation by turning MOSFET Q4, and subsequently MOSFET Q5, OFF. However, the trapped charge stored on the gate 14 of MOSFET Q5 must also be discharged or if the reset input is removed too soon, the voltage on node A will increase to a nonground condition. Accordingly, MOSFET Q3 is used to discharge node 3 and prevent MOSFET Q5 from operating whenever the output is being discharged. To this end, when the RESET input is applied to gate 2 of MOSFET Q2, it is also simultaneously applied to the gate 17 of MOSFET Q3. This turns ON MOSFET Q3 whose drain 18 is connected to node 3 (gate 14) and whose source 19 is grounded. Thus MOSFET Q3 provides a discharge path to ground for the gate 14 of MOSFET Q5 turning it OFF (providing an open circuit between the source V2 and output node A) and insuring a rapid and complete discharge of the output node A.

It is noted that when the output node A is at the high state, leakage will (in a matter of milliseconds) cause the circuit to "unwind" so that the output will decay to ground. Thus the latch is only quasi-permanent. The addition of a refresh clock coupled to output node A via MOSFET Q6 connected as a conditional capacitor (that is, with its drain 22 and source 23 connected together) can insure a permanent latch condition for the high output voltage.

The clock signal is connected to the common drain-source node and the gate 24 of MOSFET Q6 is connected to node A. When the voltage at node a is at the high level (selected to be above the threshold of MOSFET Q6) the MOSFET Q6 exhibits a high capacitance permitting coupling of the clock pulse to node A. This constant pulsing refreshes the voltage at node A preventing the circuit from unwinding. The clock need not be synchronized with the input. It is simply providing a voltage boost on a periodic basis and its frequency must only be high enough so that a boost is provided before the output voltage decays below a level detectable as the high state or below which MOSFET Q6's coupling is not sufficient to accomplish the refresh. When the output is at the low state, the capacitance of MOSFET Q6 is low and hence no significant coupling of the clock is provided.

This circuit provides a number of advantages over previous circuits such as that in FIG. 1. It is inherently ratioless. Output state changes are effected by the switching of the input switch devices (MOSFET Q1 and MOSFET Q2) only, without any impedance loading by the rest of the circuit. This permits the circuit designer of the MOSFET embodiment to utilize devices of minimum size or selected device areas in accordance with speed requirements. Hence, the units can be fabricated in a most economical fashion.

The configuration also offers very rapid switching time since there is only the one gate delay (the input device) from input to output. A further advantage is that the input devices can be cascaded in parallel so that a plurality of set or reset pulses can be used to trigger the circuit. In addition, the circuit does not consume dc power in the latched state. Unlike the circuit of FIG. 1, there is no dc path to ground when the output is latched to the high state.

However, the circuit is limited in certain aspects. The need for the refresh clock, even though it is not synchronized to any other signal, may present problems for some application where such a clock is not available. Further, the output voltage is a function of the input voltage where the input voltage is less than or equal to the drain voltage source V1. When the input voltage is more than a threshold higher than V1, the output voltage level is dependent upon the supply voltages V1, V2, and V3, which may be of equal or different magnitudes depending upon the application. Finally, the circuit of FIG. 2 latches only to the high state. However, if two circuits, such as are illustrated in FIG. 2, are combined, latching to both the high and the low states is possible.

Figure 3:
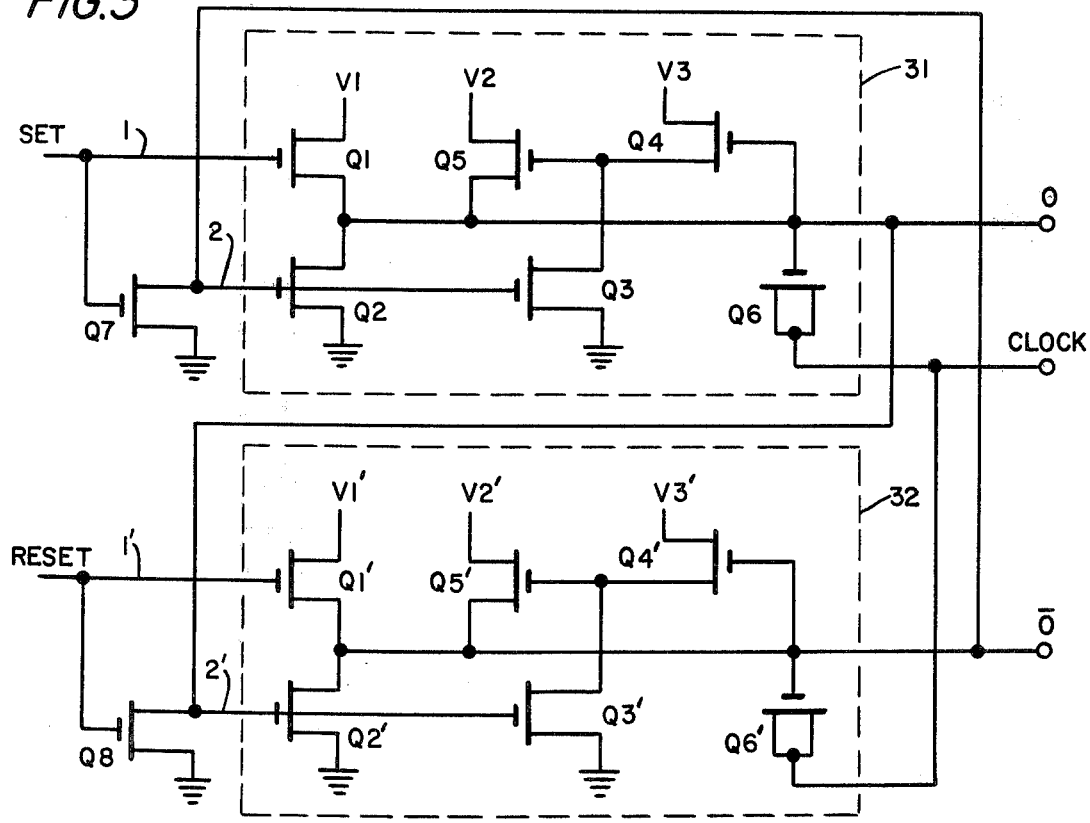
FIG. 3 is a schematic diagram of a pair of latch circuits coupled to latch two inverse outputs in accordance with the invention.

Such a combined circuit, shown in FIG. 3, includes two portions 31 and 32, each of which is identical to the circuit of FIG. 2. Portion 31 latches output 0 to the high input as in the FIG. 2 circuit and all of its elements are designated by the same numbers used in FIG. 2. Portion 32 is also identical to the circuit of FIG. 2; it is used to latch the output 0 to the ground stte and all of its elements are designated by primed numbers corresponding to the numbers used in FIG. 2.

The input is applied to terminal 1 of portion 31 and this functions as described with regard to FIG. 2 to latch to the high output at the 0 terminal. This output is also coupled to terminal 2' of portion 32 which acts to clear portion 32 as if it were a RESET input in FIG. 2, thus producing a low (or ground) output at the $\overline{0}$ terminal. However, since the latched high output from portion 31 is continuous, the input to terminal 2' is continuous and the low output at the $\overline{0}$ terminal is also latched.

Similarly, the RESET input is applied to terminal 1' of portion 32 which produces a latched high output at the $\overline{0}$ terminal (the RESET input is also applied to MOSFET Q8 to ground terminal 2' and prevents ratioed operation). This high output is also coupled to terminal 2 of portion 31. This, in turn, clears portion 31 producing a latched low output at the 0 output terminal.

This combined circuit has the same advantageous characteristics as does the circuit of FIG. 2. It is ratioless, operates without dc power consumption, is economical to fabricate, and can be relatively fast-acting. In addition, it offers a number of other advantages. In particular, it provides two complementary latched outputs (at 0 and $\overline{0}$) without an additional stage of inversion. More particularly, each output is latched to the low (ground) state as well as the high state. It is noted that even with the duplication of elements, the circuit of FIG. 3 would still consume less power and could occupy less semiconductor area than the circuit of FIG. 1.

In all cases it is to be understood that the above described arrangements are merely illustrative of a small number of the many possible applications of the principles of the present invention. Numerous and varied other arrangements in accordance with these principles may readily be devised by those skilled in the art without departing from the spirit and scope of the invention.

What is claimed is:

1. A latch circuit comprising:
   a first input terminal;
   a second input terminal;
   an output terminal;
   set means connected to the first input terminal and responsive to a first input pulse applied thereto for establishing a first selected output voltage at the output terminal;
   detecting means connected to the output terminal for sensing the presence of the first selected output voltage and for producing an enabling signal exclusively in response to the presence of the first selected output voltage;
   swich means responsive to the enabling signal for providing an additional voltage to the output terminal to maintain the voltage at the output terminal at the first selected output voltage;
   reset means connected to the second input terminal and responsive to a second input pulse applied thereto for establishing a second selected output voltage, different from the first selected output voltage, at the output terminal; and
   means connected to the switch means and operating in conjunction with the reset means, for preventing the switch means from responding to the enabling signal.

2. A latch circuit as claimed in claim 1 wherein the switch means provides an open circuit between the source of the additional voltage and the output terminal in the absence of the enabling signal.

3. A latch circuit as claimed in claim 1 further comprising clock means connected to the output terminal for periodically applying a further additional voltage to the output terminal exclusively when the voltage at the output terminal is being maintained at the first selected output voltage.

4. A latch circuit comprising:
   a first input;
   a second input;
   an output;
   a first input field-effect transistor, having its drain-source path connected between a first voltage source and the output, and having its gate connected to the first input, so that a voltage pulse applied to the first input causes a first level output voltage to appear at the output;
   a second field-effect transistor, having its drain-source path connected between the output and a point at a reference potential, and its gate connected to the second input, so that a voltage pulse applied to the second input causes the reference potential to appear at the output;
   a sensing field-effect transistor, having its drain-source path connected between a second voltage source and an intermediate node and its gate connected to the output so that when the first level output voltage appears at the output, the sensing transistor turns ON causing an enabling voltage to appear at the intermediate node;
   a switching field-effect transistor having its drain-source path connected directly between a third voltage source and the output and its gate connected to the intermediate node, the enabling voltage turning the switching transistor ON thereby causing a voltage from the third voltage source to be applied to the output exclusively when the first level output voltage is sensed by the sensing transistor;
   a discharge field-effect transistor, having its drain-source path connected between the intermediate node and the reference potential and its gate connected to the second input, so that when a voltage pulse is applied to the second input, the discharge transistor is turned ON causing the enabling voltage to be discharged to the reference potential.

5. A latch circuit as claimed in claim 4 further comprising means for coupling a periodic pulse signal to the output, said coupling occurring exclusively when the first level output voltage is present at the output.

6. A latch circuit as claimed in claim 5 wherein the means for coupling is a field-effect transistor coupled as a conditional capacitor between a clock source and the output.

7. A latch circuit as claimed in claim 4 wherein the field-effect transistors are each metal-oxide-semiconductor transistors of the P-channel enhancement mode type, and wherein the reference potential is ground and the first, second, and third voltage sources provide potentials negative relative to ground.

8. A latch circuit of the type having
   a first input;
   a second input;
   an output;
   a first input field-effect transistor having its drain-source path connected between a voltage source and an output and having its gate connected to the first input so that a voltage pulse applied to the first input causes a first level output voltage to appear at the output;
   a second field-effect transistor having its drain-source path connected between the output and a reference node and its gate connected to the second input so that a voltage pulse applied to the second input causes the voltage of the reference node to appear at the output; and
   latch means for sensing the voltage at the output and causing the first level output voltage to be maintained at the output when the first level output voltage is sensed thereat;
   characterized in that the latch means comprises:
   a sensing field-effect transistor having its drain-source path connected between the voltage source and an intermediate node and its gate connected to the output so that when the first level output voltage appears at the output, the sensing transistor turns ON, causing an enabling voltage to appear at the intermediate node;
   a switching field-effect transistor having its drain-source path connected directly between the voltage source and the output and its gate connected to the intermediate node, the enabling voltage turning the switching transistor ON, thereby providing a conductive path from the voltage source to the output exclusively when the first level out-put voltage is sensed by the sensing transistor;
   a discharge field-effect transistor having its drain-source path connected between the intermediate node and the reference node and its gate connected to the second input so that when a voltage pulse is applied to the second input, the discharge transistor is turned ON causing the enabling voltage to be discharged to the voltage of the reference node; and means for coupling a periodic voltage to the output when the first level output voltage is present at the output.

9. A latch circuit comprising:
a first input terminal;
a second input terminal;
a first output terminal;
a second output terminal;
set means connected to the first input terminal and responsive to a first input pulse supplied thereto for establishing a first selected output voltage at the first output terminal;
first sensing means connected to the first output terminal for sensing the presence of the first selected output voltage at the first output terminal and for producing a first enabling signal in response to the presence of the first selected output voltage at the first output terminal;
first switch means responsive to the first enabling signal for providing an additional voltage to the first output terminal to maintain the first output terminal at the first selected output voltage;
reset means connected to the second input terminal and responsive to a second input pulse supplied thereto for establishing a second selected output voltage at the second output terminal;
second sensing means connected to a second output terminal for sensing the presence of a second selected output voltage thereat and for producing a second enabling signal in response to the presence of the second selected output voltage at the second output terminal;
second switch means responsive to the second enabling signal for providing an additional voltage to the second output terminal to maintain the second output terminal at the second selected output voltage;
a first clear means connected to the second output terminal, responsive exclusively to the second selected output voltage at the second output terminal, for discharging the voltage at the first output terminal to a reference potential and for preventing the first switch means from responding to the first enabling signal, thereby providing the reference potential at the first output terminal in response to the presence of the second selected output voltage on the second output terminal;
a second clear means connected to the first output terminal, responsive exclusively to the first selected output voltage at the first output terminal, for discharging second output terminal to the reference potential and preventing the second switch means from responding to the second enabling signal, thereby providing the reference potential at the second output terminal in response to the first selected output voltage at the first selected output terminal,
means connecting a periodic voltage source to the first output terminal exclusively when the first output terminal is at the first selected output voltage; and
means connecting the periodic voltage source to the second output terminal exclusively when second output terminal is at the second selected output voltage.

10. A ratioless MOSFET latch circuit comprising:
input means for establishing, independent of impedance ratios of the circuit, one of two alternative states at an output in accordance with input signals;
a switch MOSFET connected between a voltage source and the output;
a sensing MOSFET connected to the output for detecting the state at the output and for enabling the switch MOSFET, exclusively upon detection of a selected one of the two states, so that the voltage source is conductively connected to the output, whereby the output is maintained at the one selected state;
a discharge MOSFET connected to the switch MOSFET, operable exclusively when the output is at the unselected one of the two states, for insuring the disconnection of the voltage source to the output when the output is at the unselected one of the two states; and
a coupling means for capacitively coupling a periodic voltage to the output exclusively when the output is at the selected one of the two states.

* * * * *